United States Patent
Krumpelman et al.

(10) Patent No.: US 9,449,768 B2
(45) Date of Patent: Sep. 20, 2016

(54) STABILIZATION TECHNIQUES FOR KEY ASSEMBLIES AND KEYBOARDS

(71) Applicant: SYNAPTICS INCORPORATED, San Jose, CA (US)

(72) Inventors: Doug Krumpelman, Hayden, ID (US); Peter Bokma, Coeur d'Alene, ID (US)

(73) Assignee: Synaptics Incorporated, San Jose, CA (US)

( * ) Notice: Subject to any disclaimer, the term of this patent is extended or adjusted under 35 U.S.C. 154(b) by 219 days.

(21) Appl. No.: 14/138,739

(22) Filed: Dec. 23, 2013

(65) Prior Publication Data
US 2014/0190810 A1    Jul. 10, 2014

Related U.S. Application Data

(60) Provisional application No. 61/748,923, filed on Jan. 4, 2013.

(51) Int. Cl.
*H01H 9/26* (2006.01)
*H01H 13/72* (2006.01)
(Continued)

(52) U.S. Cl.
CPC .......... *H01H 3/122* (2013.01); *G01R 27/2605* (2013.01); *G06F 3/0202* (2013.01);
(Continued)

(58) Field of Classification Search
CPC ........ H01H 9/26; H01H 13/72; H01H 13/76; H01H 3/00; H01H 3/02; H01H 3/04; H01H 3/12; H01H 5/02; H01H 9/02; H01H 13/00; H01H 13/04; H01H 13/10; H01H 13/14; H01H 13/20; H01H 13/50; H01H 13/70; H01H 13/86; H01H 21/04; H01H 21/36; H01H 21/54; H01H 2013/50; H01H 2215/042; H01H 2215/05; H01H 2215/052; H01H 23/00; H01H 2013/00; H01H 2021/00; H01H 2036/00; H01H 2036/0086; H01H 2036/0093; H01H 2205/00; H01H 2205/004; H01H 2205/01; H01H 2205/016; H01H 2221/04; H01H 2237/004
USPC ........................................................ 200/5 A
See application file for complete search history.

(56) References Cited

U.S. PATENT DOCUMENTS 2,482,548 A    9/1949   Kerkhof et al.
5,463,388 A    10/1995  Boie et al.
(Continued)

OTHER PUBLICATIONS

International Preliminary Report on Patentability issued in the corresponding application No. PCT/US2014/010172, mailed Jul. 16, 2015 (11 pages).
(Continued)

*Primary Examiner* — Renee S Luebke
*Assistant Examiner* — Anthony R. Jimenez
(74) *Attorney, Agent, or Firm* — Osha Liang LLP

(57) ABSTRACT

Key stabilization techniques for a key assembly or keyboard are provided. In one embodiment, a key assembly includes a keycap having a touch surface for receiving a press force that moves the keycap from an unpressed position toward a pressed position. The key assembly also includes a base having a planar-translation effecting mechanism supporting the keycap to guide the keycap in the press direction and the second direction as the keycap moves from the unpressed position toward the pressed position. A key stabilization mechanism positioned in the keycap, the base or both the keycap and the base configured to the stabilize the keycap so that the touch surface remains substantially planar while the keycap moves from the unpressed position toward the press position to resist tilt of the keycap and rotation of the keycap about an axis in the press direction as keycap moves toward the pressed position.

23 Claims, 8 Drawing Sheets

(51) Int. Cl.
  *H01H 13/76* (2006.01)
  *H01H 3/12* (2006.01)
  *H01H 13/7065* (2006.01)
  *G01R 27/26* (2006.01)
  *G06F 3/02* (2006.01)
  *H03K 17/96* (2006.01)
  *H03K 17/98* (2006.01)

(52) U.S. Cl.
  CPC ...... *H01H13/7065* (2013.01); *H01H 2217/01* (2013.01); *H01H 2221/04* (2013.01); *H03K 17/9622* (2013.01); *H03K 17/98* (2013.01); *H03K 2217/96079* (2013.01)

(56) References Cited

U.S. PATENT DOCUMENTS

| | | | |
|---|---|---|---|
| 8,309,870 B2* | 11/2012 | Peterson et al. | 200/344 |
| 2001/0000125 A1 | 4/2001 | Zimmerman et al. | |
| 2007/0273560 A1 | 11/2007 | Hua et al. | |
| 2008/0264770 A1 | 10/2008 | Purcocks | |
| 2008/0302647 A1* | 12/2008 | Villain et al. | 200/343 |
| 2010/0243420 A1 | 9/2010 | Lin | |
| 2011/0303521 A1 | 12/2011 | Niu et al. | |
| 2012/0001775 A1 | 1/2012 | Sellers | |
| 2012/0228111 A1 | 9/2012 | Peterson et al. | |
| 2012/0268384 A1 | 10/2012 | Peterson et al. | |
| 2012/0299832 A1 | 11/2012 | Peterson et al. | |

OTHER PUBLICATIONS

International Searching Authority, Korean Intellectual Property Office, International Search Report and Written Opinion for International Application No. PCT/US2014/010172, mailed May 19, 2014.

International Searching Authority, Korean Intellectual Property Office, International Search Report and Written Opinion for International Application No. PCT/US2014/010196, mailed Jun. 3, 2014.

Office Action issued in the related U.S. Appl. No. 14/146,811, mailed Dec. 9, 2015 (8 pages).

* cited by examiner $F_1$: Peak Force
$F_2$: Contact Force
Snap Ratio= $(F_1-F_2)/(F_1)$

STABILIZATION TECHNIQUES FOR KEY ASSEMBLIES AND KEYBOARDS

RELATED APPLICATION(S)

This application claims priority to U.S. Provisional Patent Application No. 61/748,923 filed Jan. 4, 2013.

FIELD OF THE INVENTION

This invention generally relates to electronic devices.

BACKGROUND OF THE INVENTION

Pressable touchsurfaces (touch surfaces that can be pressed) are widely used in a variety of input devices, including as the surfaces of keys or buttons for keypads or keyboards, and as the surfaces of touch pads or touch screens. It is desirable to improve the usability of these input systems.

FIG. 2 shows a graph 200 of an example tactile response curve associated with the "snapover" haptic response found in many keys enabled with metal snap domes or rubber domes. Specifically, graph 200 relates force applied to the user by a touchsurface of the key and the amount of key displacement (movement relative to its unpressed position). The force applied to the user may be a total force or the portion of the total force along a particular direction such as the positive or negative press direction. Similarly, the amount of key displacement may be a total amount of key travel or the portion along a particular direction such as the positive or negative press direction.

The force curve 210 shows four key press states 212, 214, 216, 218 symbolized with depictions of four rubber domes at varying amounts of key displacement. The key is in the "unpressed" state 212 when no press force is applied to the key and the key is in the unpressed position (i.e., "ready" position). In response to press input, the key initially responds with some key displacement and increasing reaction force applied to the user. The reaction force increases with the amount of key displacement until it reaches a local maximum "peak force" $F_1$ in the "peak" state 214. In the peak state 214, the metal snap dome is about to snap or the rubber dome is about to collapse. The key is in the "contact" state 216 when the keycap, snap dome or rubber dome, or other key component moved with the keycap makes initial physical contact with the base of the key (or a component attached to the base) with the local minimum "contact force" $F_2$. The key is in the "bottom" state 218 when the key has travelled past the "contact" state and is mechanically bottoming out, such as by compressing the rubber dome in keys enabled by rubber domes.

A snapover response is defined by the shape of the reaction force curve—affected by variables such as the rate of change, where it peaks and troughs, and the associated magnitudes. The difference between the peak force $F_1$ and the contact force $F_2$ can be termed the "snap." The "snap ratio" can be determined as $(F_1-F_2)/F_1$ (or as $100*(F_1-F_2)/F_1$, if a percent-type measure is desired).

BRIEF SUMMARY OF THE INVENTION

Key stabilization techniques for a key assembly or keyboard is provided. In one embodiment, a key assembly includes a keycap having a touch surface for receiving a press force that moves the keycap from an unpressed position toward a pressed position. The unpressed position and pressed position separated in a press direction and a second direction orthogonal to the press direction. The key assembly also includes a base having a planar-translation effecting mechanism supporting the keycap to guide the keycap in the press direction and the second direction as the keycap moves from the unpressed position toward the pressed position. A key stabilization mechanism positioned in the keycap, the base or both the keycap and the base configured to the stabilize the keycap so that the touch surface remains substantially planar while the keycap moves from the unpressed position toward the press position to resist tilt of the keycap and rotation of the keycap about an axis in the press direction as keycap moves toward the pressed position.

A method for key stabilization is provided. The method includes effecting the motion of a keycap supported in an unpressed position by a planar-translation effecting mechanism and configured to move between the unpressed position and a pressed position, wherein the unpressed and pressed positions are separated in a press direction and in a second direction orthogonal to the press direction. In response to an off-center press force on one side portion of a touch surface of the keycap, a reverse ramp contacting feature of the keycap contacts a reverse ramp feature in the base, thereby driving an opposite side portion of the keycap toward the planar-translation effecting mechanism as the keycap moves toward the press direction.

BRIEF DESCRIPTION OF DRAWINGS

Example embodiments of the present invention will hereinafter be described in conjunction with the appended drawings which are not to scale unless otherwise noted, where like designations denote like elements, and.

DETAILED DESCRIPTION OF THE INVENTION

The following detailed description is merely exemplary in nature and is not intended to limit the invention or the application and uses of the invention.

Various embodiments of the present invention provide input devices and methods that facilitate improved usability, thinner devices, easier assembly, lower cost, more flexible industrial design, or a combination thereof. These input devices and methods involve pressable touchsurfaces that may be incorporated in any number of devices. As some examples, pressable touchsurfaces may be implemented as surfaces of touchpads, touchscreens, keys, buttons, and the surfaces of any other appropriate input device. Thus, some non-limiting examples of devices that may incorporate pressable touchsurfaces include personal computers of all sizes and shapes, such as desktop computers, laptop computers, netbooks, ultrabooks, tablets, e-book readers, personal digital assistants (PDAs), and cellular phones including smart phones. Additional example devices include data input devices (including remote controls, integrated keyboards or keypads such as those within portable computers, or peripheral keyboards or keypads such as those found in tablet covers or stand-alone keyboards, control panels, and computer mice), and data output devices (including display screens and printers). Other examples include remote terminals, kiosks, point-of-sale devices, video game machines (e.g., video game consoles, portable gaming devices, and the like) and media devices (including recorders, editors, and players such as televisions, set-top boxes, music players, digital photo frames, and digital cameras).

The discussion herein focuses largely on rectangular touchsurfaces. However, the touchsurfaces for many embodiments can comprises other shapes. Example shapes include triangles, quadrilaterals, pentagons, polygons with other numbers of sides, shapes similar to polygons with rounded corners or nonlinear sides, shapes with curves, elongated or circular ellipses circles, combinations shapes with portions of any of the above shapes, non-planar shapes with concave or convex features, and any other appropriate shape.

In addition, although the discussion herein focuses largely on the touchsurfaces as being atop rigid bodies that undergo rigid body motion, some embodiments may comprise touchsurfaces atop pliant bodies that deform. "Rigid body motion" is used herein to indicate motion dominated by translation or rotation of the entire body, where the deformation of the body is negligible. Thus, the change in distance between any two given points of the touchsurface is much smaller than an associated amount of translation or rotation of the body.

Also, in various implementations, pressable touchsurfaces may comprise opaque portions that block light passage, translucent or transparent portions that allow light passage, or both.

Figure 1:
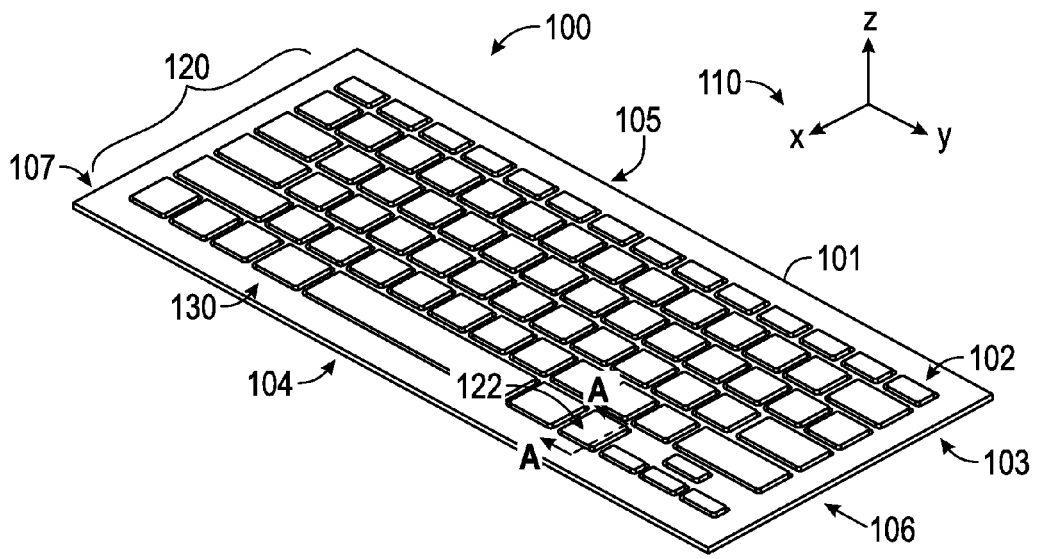
FIG. 1 shows an example keyboard that incorporates one or more implementations of key-based touchsurfaces configured in accordance with the techniques described herein.

FIG. 1 shows an example keyboard 100 that incorporates a plurality of (two or more) pressable key-based touchsurfaces configured in accordance with the techniques described herein. The example keyboard 100 comprises rows of keys 120 of varying sizes surrounded by a keyboard bezel 130. Keyboard 100 has a QWERTY layout, even though the keys 120 are not thus labeled in FIG. 1. Other keyboard embodiments may comprise different physical key shapes, key sizes, key locations or orientations, or different key layouts such as DVORAK layouts or layouts designed for use with special applications or non-English languages. In some embodiments, the keys 120 comprise keycaps that are rigid bodies, such as rigid rectangular bodies having greater width and breadth than depth (depth being in the Z direction as explained below). Also, other keyboard embodiments may comprise a single pressable key-based touchsurface configured in accordance with the techniques described herein, such that the other keys of these other keyboard embodiments are configured with other techniques.

Orientation terminology is introduced here in connection with FIG. 1, but is generally applicable to the other discussions herein and the other figures unless noted otherwise. This terminology introduction also includes directions associated with an arbitrary Cartesian coordinate system. The arrows 110 indicate the positive directions of the Cartesian coordinate system, but do not indicate an origin for the coordinate system. Definition of the origin will not be needed to appreciate the technology discussed herein.

The face of keyboard 100 including the exposed touchsurfaces configured to be pressed by users is referred to as the "top" 102 of the keyboard 100 herein. Using the Cartesian coordinate directions indicated by the arrows 110, the top 102 of the keyboard 100 is in the positive-Z direction relative to the bottom 103 of the keyboard 100. The part of the keyboard 100 that is typically closer to the body of a user when the keyboard 100 is in use atop a table top is referred to as the "front" 104 of the keyboard 100. In a QWERTY layout, the front 104 of the keyboard 100 is closer to the space bar and further from the alphanumeric keys. Using the Cartesian coordinate directions indicated by the arrows 110, the front 104 of the keyboard 100 is in the positive-X direction relative to the back 105 of the keyboard 100. In a typical use orientation where the top 102 of the keyboard 100 is facing upwards and the front 104 of the keyboard 100 is facing towards the user, the "right side" 106 of the keyboard 100 is to the right of a user. Using the Cartesian coordinate directions indicated by the arrows 110, the right side 106 of the keyboard 100 is in the positive-Y direction relative to the "left side" 107 of the keyboard 100. With the top 102, front 104, and right side 106 thus defined, the "bottom" 103, "back" 105, and "left side" 107 of the keyboard 100 are also defined.

Using this terminology, the press direction for the keyboard 100 is in the negative-Z direction, or vertically downwards toward the bottom of the keyboard 100. The X and Y directions are orthogonal to each other and to the press direction. Combinations of the X and Y directions can define an infinite number of additional lateral directions orthogonal to the press direction. Thus, example lateral directions include the X direction (positive and negative), the Y direction (positive and negative), and combination lateral directions with components in both the X and Y directions but not the Z direction. Motion components in any of these lateral directions is sometimes referred herein as "planar," since such lateral motion components can be considered to be in a plane orthogonal to the press direction.

Some or all of the keys of the keyboard 100 are configured to move between respective unpressed and pressed positions that are spaced in the press direction and in a lateral direction orthogonal to the press direction. That is, the touchsurfaces of these keys exhibit motion having components in the negative Z-direction and in a lateral direction. In the examples described herein, the lateral component is usually in the positive X-direction or in the negative X-direction for ease of understanding. However, in various embodiments, and with reorientation of select key elements as appropriate, the lateral separation between the unpressed and the pressed positions may be solely in the positive or negative X-direction, solely in the positive or negative Y-direction, or in a combination with components in both the X and Y directions.

Thus, these keys of the keyboard 100 can be described as exhibiting "diagonal" motion from the unpressed to the pressed position. This diagonal motion is a motion including both a "Z" (or vertical) translation component and a lateral (or planar) translation component. Since this planar translation occurs with the vertical travel of the touchsurface, it may be called "planar translational responsiveness to vertical travel" of the touchsurface, or "vertical-lateral travel."

Some embodiments of the keyboard 100 comprise keyboards with leveled keys that remain, when pressed during normal use, substantially level in orientation through their respective vertical-lateral travels. That is, the keycaps of these leveled keys (and thus the touchsurfaces of these keys) exhibit little or no rotation along any axes in response to presses that occur during normal use. Thus, there is little or no roll, pitch, and yaw of the keycap and the associated touchsurfaces remain relatively level and substantially in the same orientation during their motion from the unpressed position to the pressed position.

In various embodiments, the lateral motion associated with the vertical-lateral travel can improve the tactile feel of the key by increasing the total key travel for a given amount of vertical travel in the press direction. In various embodiments, the vertical-lateral travel also enhances tactile feel by imparting to users the perception that the touchsurface has travelled a larger vertical distance than actually travelled. For example, the lateral component of vertical-lateral travel may apply tangential friction forces to the skin of a finger pad in contact with the touchsurface, and cause deformation of the skin and finger pad that the user perceives as additional vertical travel. This then creates a tactile illusion of greater vertical travel. In some embodiments, returning the key from the pressed to the unpressed position on the return stroke also involves simulating greater vertical travel using lateral motion.

To enable the keys 120 of the keyboard 100 with vertical-lateral travel, the keys 120 are parts of key assemblies each comprising mechanisms for effecting planar translation, readying the key 120 by holding the associated keycap in the unpressed position, and returning the key 120 to the unpressed position. Some embodiments further comprise mechanisms for leveling keycaps. Some embodiments achieve these functions with a separate mechanism for each function, while some embodiments achieve two or more of these functions using a same mechanism. For example, a "biasing" mechanism may provide the readying function, the returning function, or both the readying and returning functions. Mechanisms which provide both readying and returning functions are referred to herein as "ready/return" mechanisms. As another example, a leveling/planar-translation-effecting mechanisms may level and effect planar translation. As further examples, other combinations of functions may be provided by a same mechanism.

The keyboard 100 may use any appropriate technology for detecting presses of the keys of the keyboard 100. For example, the keyboard 100 may employ a key switch matrix based on conventional resistive membrane switch technology. The key switch matrix may be located under the keys 120 and configured to generate a signal to indicate a key press when a key 120 is pressed. Alternatively, the example keyboard 100 may employ other key press detection technology to detect any changes associated with the fine or gross change in position or motion of a key 120. Example key press detection technologies include various capacitive, resistive, inductive, magnetic, force or pressure, linear or angular strain or displacement, temperature, aural, ultrasonic, optical, and other suitable techniques. With many of these technologies, one or more preset or variable thresholds may be defined for identifying presses and releases.

As a specific example, capacitive sensor electrodes may be disposed under the touchsurfaces, and detect changes in capacitance resulting from changes in press states of touchsurfaces. The capacitive sensor electrodes may utilize "self capacitance" (or "absolute capacitance") sensing methods based on changes in the capacitive coupling between the sensor electrodes and the touchsurface. In some embodiments, the touchsurface is conductive in part or in whole, or a conductive element is attached to the touchsurface, and held at a constant voltage such as system ground. A change in location of the touchsurface alters the electric field near the sensor electrodes below the touchsurface, thus changing the measured capacitive coupling. In one implementation, an absolute capacitance sensing method operates with a capacitive sensor electrode underlying a component having the touchsurface, modulates that sensor electrodes with respect to a reference voltage (e.g., system ground), and detects the capacitive coupling between that sensor electrode and the component having the touchsurface for gauging the press state of the touchsurface.

Some capacitive implementations utilize "mutual capacitance" (or "transcapacitance") sensing methods based on changes in the capacitive coupling between sensor electrodes. In various embodiments, the proximity of a touchsurface near the sensor electrodes alters the electric field between the sensor electrodes, thus changing the measured capacitive coupling. The touchsurface may be a conductive or non-conductive, electrically driven or floating, as long as its motion causes measurable change in the capacitive coupling between sensor electrodes. In some implementations, a transcapacitive sensing method operates by detecting the capacitive coupling between one or more transmitter sensor electrodes (also "transmitters") and one or more receiver sensor electrodes (also "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive.

In one implementation, a trans-capacitance sensing method operates with two capacitive sensor electrodes underlying a touchsurface, one transmitter and one receiver. The resulting signal received by the receiver is affected by the transmitter signal and the location of the touchsurface.

In some embodiments, the sensor system used to detect touchsurface presses may also detect pre-presses. For example, a capacitive sensor system may also be able to detect a user lightly touching a touchsurface, and distinguish that from the press of the touchsurface. Such a system can support multi-stage touchsurface input, which can respond differently to light touch and press.

Some embodiments are configured to gauge the amount of force being applied on the touchsurface from the effect that the force has on the sensor signals. That is, the amount of depression of the touchsurface is correlated with one or more particular sensor readings, such that the amount of press force can be determined from the sensor reading(s).

In some embodiments, substrates used for sensing are also used to provide backlighting associated with the touchsurfaces. As a specific example, in some embodiments utilizing capacitive sensors underlying the touchsurface, the capacitive sensor electrodes are disposed on a transparent or translucent circuit substrate such as polyethylene terephthalate (PET), another polymer, or glass. Some of those embodiments use the circuit substrate as part of a light guide system for backlighting symbols viewable through the touchsurfaces.

FIG. 1 also shows a section line A-A' relative to the key 122 of the keyboard 100, which will be discussed below.

The keyboard 100 may be integrated into or coupled to computer such as a laptop computer comprising one or more processing systems. The processing system(s) each comprise one or more ICs (integrated circuits) having appropriate processor-executable instructions for responding to key presses. These instructions direct the appropriate IC(s) to operate keyboard sensors to determine if a key has been pressed (or the extent of the press), and provide an indication of press status to a main CPU of the laptop or a response to the press status to a user of the laptop.

While the orientation terminology, vertical-lateral travel, sensing technology, and implementation options discussed here focuses on the keyboard 100, these discussions are readily analogized to other touchsurfaces and devices described herein.

Figure 2:
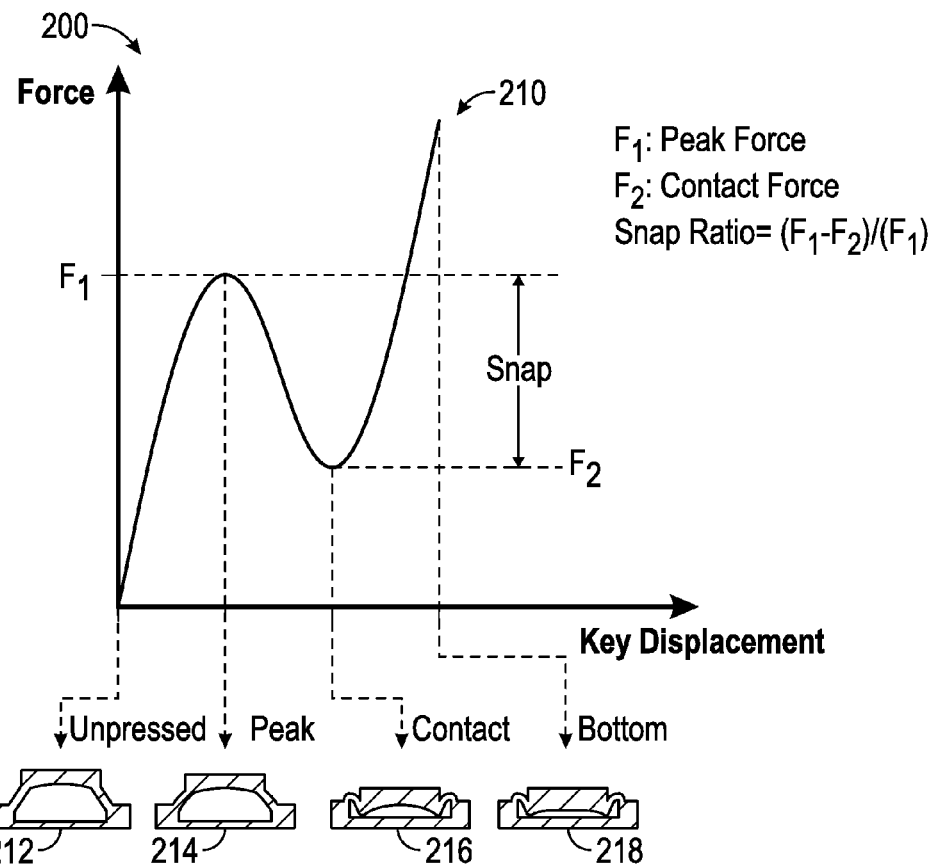
FIG. 2 is a graph of an example tactile response that is characteristic of many keys enabled with metal snap domes or rubber domes.

Various embodiments in accordance with the techniques described herein, including embodiments without metal snap domes or rubber domes, provide force response curves similar to the curve 210 of FIG. 2. Many tactile keyboard keys utilize snap ratios no less than 0.4 and no more than 0.6. Other tactile keyboard keys may use snap ratios outside of these ranges, such as no less than 0.3 and no more than 0.5, and no less than 0.5 and no more than 0.7.

Other embodiments provide other response curves having other shapes, including those with force and key travel relationships that are linear or nonlinear. Example nonlinear relationships include those which are piecewise linear, which contain linear and nonlinear sections, or which have constantly varying slopes. The force response curves may also be non-monotonic, monotonic, or strictly monotonic.

For example, the keys 120 made in accordance with the techniques described herein may be configured to provide the response shown by curve 210, or any appropriate response curve. The reaction force applied to a user may increase linearly or nonlinearly relative to an amount of total key travel, an amount of key travel the press direction, or an amount of key travel in a lateral direction. As a specific example, the force applied may increase with a constant slope relative to the amount of key travel for up to a first amount of force or key movement relative to its unpressed position, and then plateau (with constant force) or decrease for up to a second amount of force or key movement.

Figure 3A:
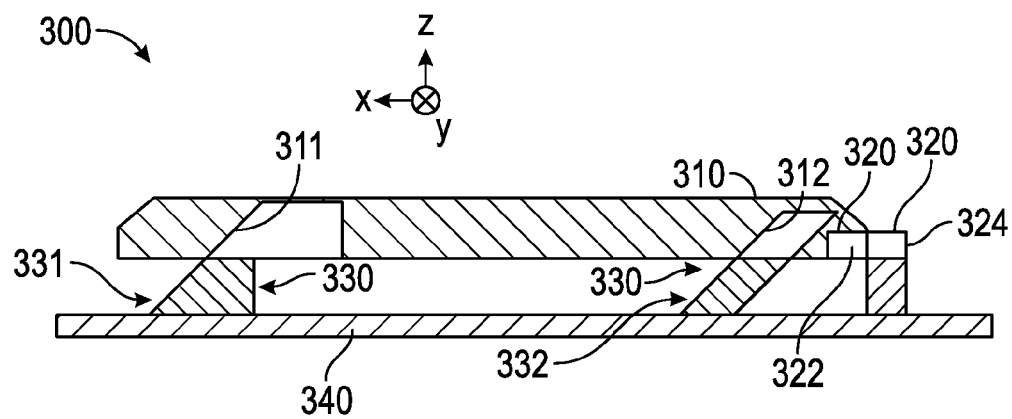
FIGS. 3A-3B are simplified side views of a first example touchsurface assembly configured in accordance with the techniques described herein.
Figure 3B:
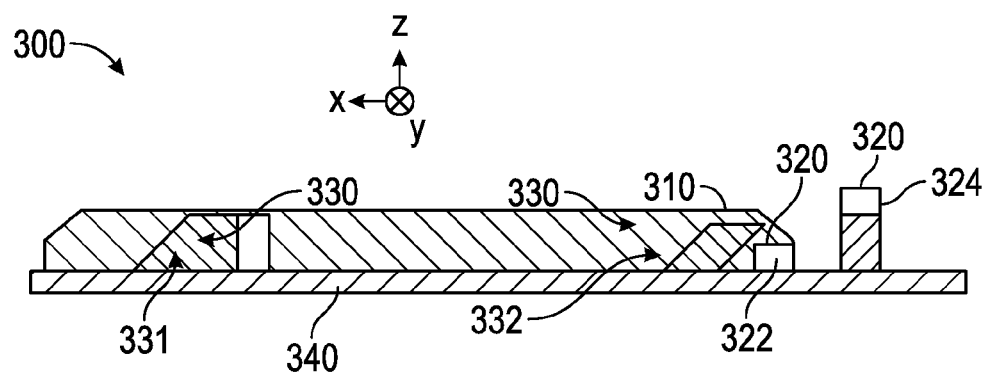

FIGS. 3A-3B are simplified cross-sectional views of a first example touchsurface assembly. The key assembly 300 may be used to implement various keys, including the key 122 of the keyboard 100. In the embodiment where FIGS. 3A-3B depict the key 122, these figures illustrate A-A' sectional views of the key 122. FIG. 3A shows the example key assembly 300 in an unpressed position and FIG. 3B shows the same key assembly 300 in a pressed position. The key assembly 300 may also be used in other devices utilizing keys, including keyboards other than the keyboard 100 and any other appropriate key-using device. Further, assemblies analogous to the key assembly 300 may be used to enable non-key touchsurface assemblies such as buttons, opaque touchpads, touchscreens, or any of the touchsurface assemblies described herein.

The key assembly 300 includes a keycap 310 that is visible to users and configured to be pressed by users, a ready/return mechanism 320, and a base 340. The unpressed and pressed positions of the keycap 310 are spaced in a press direction and in a first lateral direction orthogonal to the press direction. The press direction is analogous to the key motion found in conventional keyboards lacking lateral key motion, is in the negative-Z direction, and is the primary direction of press and key motion. In many keyboards the press direction is orthogonal to the touchsurface of the keycap or the base of the key, such that users would consider the press direction to be downwards toward the base.

The components of the key assembly 300 may be made from any appropriate material, including plastics such as polycarbonate (PC), acrylonitrile butadiene styrene (ABS), nylon, and acetal, metals such as steel and aluminum, elastomers such as rubber, and various other materials. In various embodiments, the keycap 310 is configured to be substantially rigid, such that the touchsurface of the keycap 310 appears to unaided human senses to move with rigid body motion between its unpressed and pressed positions during normal operation.

The ready/return mechanism 320 is a type of "biasing mechanism" that provides both readying and returning functions. The ready/return mechanism 320 physically biases the keycap 310 during at least part of the key press operation. It should be noted that a mechanism which only provides readying or returning function may also be termed a "biasing mechanism," if it biases the keycap 310 during at least part of the key press operation. The ready/return mechanism 320 is configured to hold the keycap 310 in its unpressed position so that the keycap 310 is ready to be pressed by a user. In addition, the ready/return mechanism 320 is also configured to return the keycap 310 partially or entirely to the unpressed position in response to a release of the press force to keycap 310. The release of the press force may be a removal of the press force, or a sufficient reduction of press force such that the key assembly is able to return the keycap 310 to the unpressed position as a matter of normal operation. In the example embodiment of FIG. 3, the key assembly 300 utilizes magnetically coupled components 322, 324 to form the ready/return mechanism 320. Magnetically coupled components 322, 324 may both comprise magnets, or one may comprise a magnet while the other comprise a magnetically coupled material such as a ferrous material. Although magnetically coupled components 322, 324 are each shown as a single rectangular shape, either or both magnetically coupled components 322, 324 may comprise non-rectangular cross-section(s) or comprise a plurality of magnetically coupled subcomponents having the same or different cross sections. For example, magnetically coupled component 322 or 324 may comprise a magnetic, box-shaped subcomponent disposed against a central portion of a ferrous, U-shaped subcomponent.

In some implementations, the magnetically coupled component 322 is physically attached to a bezel or base proximate to the keycap 310. The magnetically coupled component 324 is physically attached to the keycap and magnetically interacts with the magnetically coupled component 322. The physical attachment of the magnetically coupled components 322, 324 may be direct or indirect (indirectly being through one or more intermediate components), and may be accomplished by press fits, adhesives, or any other technique or combination of techniques. The amount of press force needed on the keycap to overcome the magnetic coupling (e.g., overpower the magnetic attraction or repulsion) can be customized based upon the size, type, shape, and positions of the magnetically coupling components 322, 324 involved.

The key assembly 300 comprises a planar-translation-effecting (PTE) mechanism 330 configured to impart planar translation to the keycap 310 when it moves between the unpressed and pressed positions, such that a nonzero component of lateral motion occurs. The PTE mechanism 330 is formed from parts of the keycap 310 and the base 340, and comprises four ramps (two ramps 331, 332 are visible in FIGS. 3A-B) disposed on the base 340. These four ramps are located such that they are proximate to the corners of the keycap 310 when the key assembly 300 is assembled. In the embodiment shown in FIGS. 3A-B, these four ramps (including ramps 331, 332) are simple, sloped planar ramps located at an angle to the base 340. These four ramps (including ramps 331, 332) are configured to physically contact corresponding ramp contacting features (two ramp contacting features 311, 312 are visible in FIGS. 3A-B) disposed on the underside of the keycap 310. The ramp contacting features of the keycap 310 may be any appropriate shape, including ramps matched to those of the ramps on the base 340.

In response to a press force applied to the touchsurface of the keycap 310 downwards along the press direction, the ramps on the base 340 (including ramps 331, 332) provide reaction forces. These reaction forces are normal to the ramps and include lateral components that cause the keycap 310 to exhibit lateral motion. The ramps and some retention or alignment features that mate with other features in the bezel or other appropriate component (not shown) help retain and level the keycap 310. That is, they keep the keycap 310 from separating from the ramps and in substantially the same orientation when travelling from the unpressed to the pressed position.

As shown by FIGS. 3A-B, the keycap 310 moves in the press direction (negative Z-direction) in response to a sufficiently large press force applied to the top of the keycap 310. As a result, the keycap 310 moves in a lateral direction (in the positive X-direction) and in the press direction (in the negative Z-direction) due to the reaction forces associated with the ramps. The ramp contacting features (e.g., 311, 312) of the keycap 310 ride on the ramps of the base 340 (e.g., 331, 332) as the keycap 310 moves from the unpressed to the pressed position. This motion of the keycap 310 moves the magnetically coupled components 322, 324 relative to each other, and changes their magnetic interactions.

FIG. 3B shows the keycap 310 in the pressed position. For the key assembly 300, the keycap 310 has moved to the pressed position when it directly or indirectly contacts the base 340 or has moved far enough to be sensed as a key press. FIG. 3A-B do not illustrate the sensor(s) used to detect the press state of the keycap 310, and such sensor(s) may be based on any appropriate technology, as discussed above.

When the press force is released, the ready/return mechanism 320 returns the keycap 310 to its unpressed position. The attractive forces between the magnetically coupled components 322, 324 pull the keycap 310 back up the ramps (including the ramps 331, 322), toward the unpressed position.

Many embodiments using magnetic forces utilize permanent magnets. Example permanent magnets include, in order of strongest magnetic strength to the weakest: neodymium iron boron, samarium cobalt, alnico, and ceramic. Neodymium-based magnets are rare earth magnets, and are very strong magnets made from alloys of rare earth elements. Alternative implementations include other rare earth magnets, non-rare earth permanent magnets, and electromagnets.

Although the key assembly 300 utilizes magnetically coupled components to form its ready/return mechanism 320, various other techniques can be used instead or in addition to such magnetic techniques in other embodiments. In addition, separate mechanisms may be used to accomplish the readying and returning functions separately. For example, one or more mechanisms may retain the keycap in its ready position and one or more other mechanisms may return the keycap to its ready position. Examples of other readying, returning, or ready/return mechanisms include buckling elastomeric structures, snapping metallic domes, deflecting plastic or metal springs, stretching elastic bands, bending cantilever beams, and the like. In addition, in some embodiments, the ready/return mechanism push (instead of pull) the keycap 310 to resist keycap motion to the pressed position or to return it to the unpressed position. Such embodiments may use magnetic repulsion or any other appropriate technique imparting push forces.

Many variations of or additions to the components of the key assembly 300 are possible. For example, other embodiments may include fewer or more components. As a specific example, another key assembly may incorporate any number of additional aesthetic or functional components. Some embodiments include bezels that provide functions such as hiding some of the key assembly from view, protecting the other components of the key assembly, helping to retain or guide the touchsurface of the key assembly, or some other function.

As another example, other embodiments may comprise different keycaps, readying mechanisms, returning mechanisms, PTE mechanisms, leveling mechanisms, or bases. As a specific example, the keycap 310, the base 340, or another component that is not shown may comprise protrusions, depressions, or other features that help guide or retain the keycap 310. As another specific example, some embodiments use non-ramp techniques in place or (or in addition to) ramps to effect planar translation. Examples other PTE mechanisms include various linkage systems, cams, pegs and slots, bearing surfaces, and other motion alignment features.

As yet another example, although the PTE mechanism 330 is shown in FIGS. 3A-B as having ramps disposed on the base 340 and ramp contacting features disposed on the keycap 310, other embodiments may have one or more ramps disposed on the keycap 310 and ramp contacting features disposed on the base 340. Also, the PTE mechanism 330 is shown in FIGS. 3A-B as having ramps 331, 332 with simple, sloped plane ramp profiles. However, in various embodiments, the PTE mechanism 330 may utilize other profiles, including those with linear, piecewise linear, or nonlinear sections, those having simple or complex curves or surfaces, or those including various convex and concave features. Similarly, the ramp contacting features on the keycap 310 may be simple or complex, and may comprise linear, piecewise linear, or nonlinear sections. As some specific examples, the ramp contacting features may comprise simple ramps, parts of spheres, sections of cylinders, and the like. Further, the ramp contacting features on the keycap 310 may make point, line, or surface contact the ramps on the base 340 (including ramps 331, 332). "Ramp profile" is used herein to indicate the contour of the surfaces of any ramps used for the PTE mechanisms. In some embodiments, a single keyboard may employ a plurality of different ramp profiles in order to provide different tactile responses for different keys.

As a further example, embodiments which level their touchsurfaces may use various leveling techniques which use none, part, or all of the associate PTE mechanism.

Figure 4:
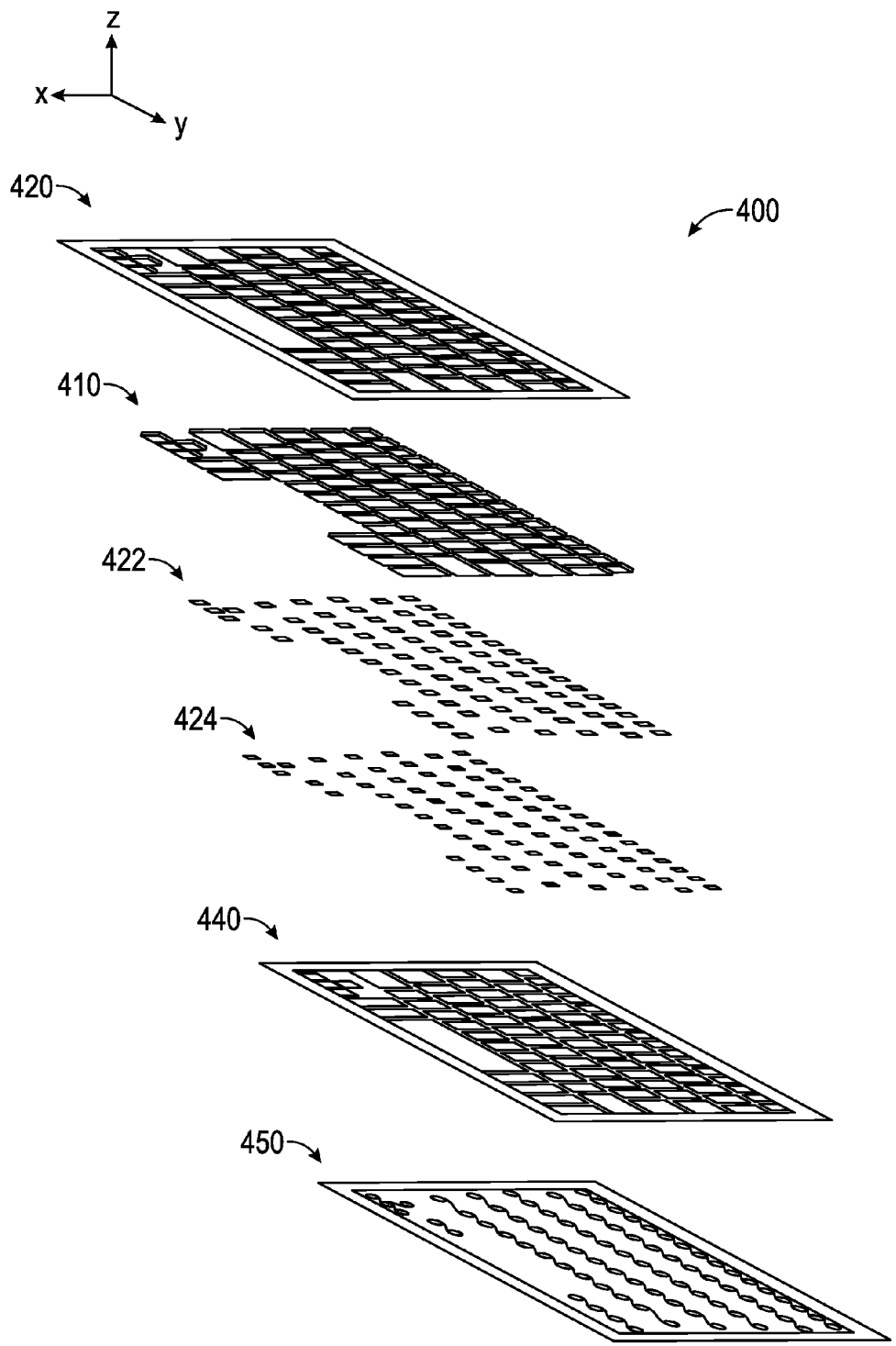
FIG. 4 shows an exploded view of an example keyboard in accordance with the techniques described herein

FIG. 4 shows an exploded view of an example keyboard construction 400 in accordance with the techniques described herein. A construction like the keyboard construction 400 may be used to implement any number of different keyboards, including keyboard 100. Proceeding from the top to the bottom of the keyboard, the bezel 420 comprises a plurality of apertures through which keycaps 410 of various sizes are accessible in the final assembly. Magnetically coupled components 422, 424 are attached to the keycaps 410 or the base 440, respectively. The base 440 comprises a plurality of PTE mechanisms (illustrated as simple rectangles on the base 440) configured to guide the motion of the keycaps 410. Underneath the base 440 is a key sensor 450, which comprises one or more layers of circuitry disposed on one or more substrates.

Various details have been simplified for ease of understanding. For example, adhesives that may be used to bond components together are not shown. Also, various embodiments may have more or fewer components than shown in keyboard construction 400, or the components may be in a different order. For example, the base and the key sensor 450 may be combined into one component, or swapped in the stack-up order.

Figure 5A:
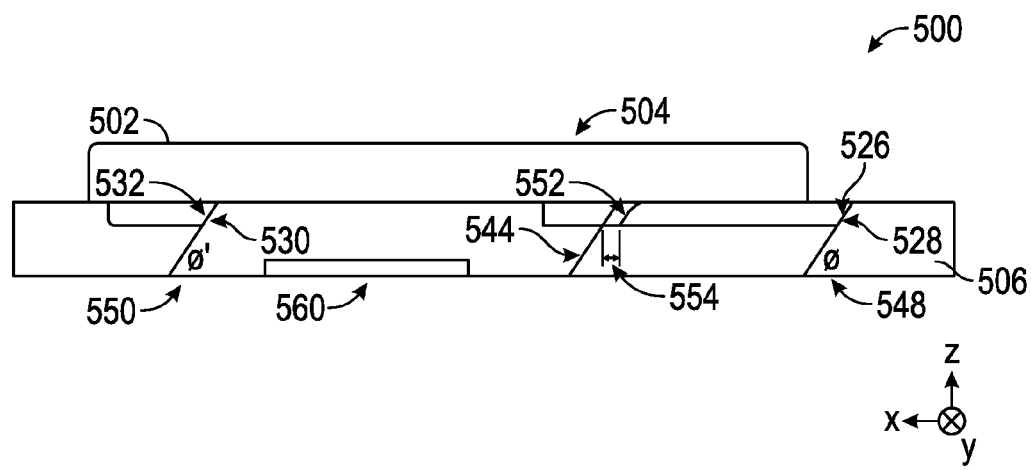
FIG. 5A-B are cross-sectional side views of a key assembly in accordance with key stabilization techniques in accordance with an embodiment.
Figure 5B:
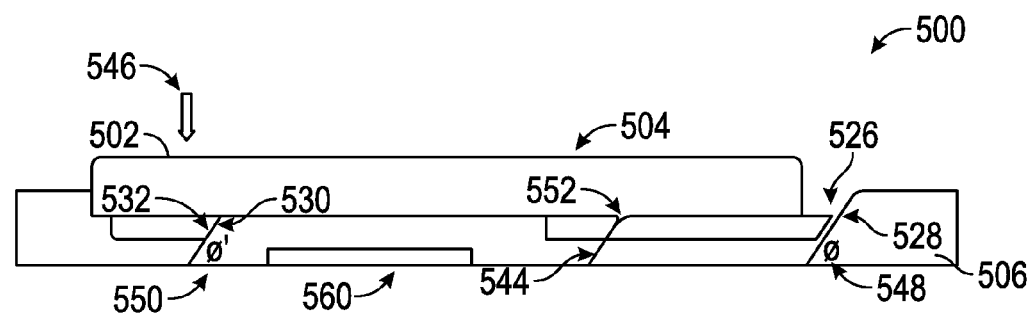

FIGS. 5A-B illustrate simple cross-sectional side views of a key assembly 500 employing a key stabilization technique. In FIG. 5A, the keycap 502 is shown in the unpressed (i.e., ready) position, while in FIG. 5B, the keycap 502 is shown in the pressed position responsive to the touchsurface 504 receiving a press force 546.

As noted above, in connection with FIGS. 3A-B, the key assembly 500 employs a planar-translation-effecting (PTE) mechanism configured to impart planar translation to the keycap 502 when it moves between the unpressed and pressed positions, such that a nonzero component of lateral (positive X direction) motion occurs. As illustrated in FIGS. 5A-B, the PTE mechanism is formed as parts of the keycap 502 and the base 506, and comprises four ramps (two ramps 528, 530 are visible in FIGS. 5A-B) disposed on the base 506. In some embodiments, these four ramps are located such that they are proximate to the corners of the keycap 502 when the key assembly 500 is assembled. To facilitate understanding, the embodiment of FIGS. 5A-B, shows the ramps (including ramps 528, 530) as simple, sloped planar ramps located at an angle relative to the base 506. These ramps are configured to physically contact corresponding ramp contacting features (two ramp contacting features 526, 532 are visible in FIGS. 5A-B) disposed on the keycap 502. The ramp contacting features of the keycap 502 may be any appropriate shape, including ramps matched to those of the ramps on the base 506.

In some embodiments, the ramp angle 548 (Ø) of the ramp 528 is between 45-70 degrees and in some embodiments comprise ramps having a ramp angle 548 of 57 degrees. In some embodiments, the ramp 530 has a ramp angle 550 (Ø') substantially the same as the ramp angle 548, while in other embodiments the ramp angle 550 is a different angle than the ramp angle 548. In those embodiments where the ramp 530 has a different ramp angle than the ramp 528, the ramp angle 550 of the ramp 530 is typically shallower than the ramp angle 548 of the ramp 528 by approximately 3-10 degrees. As a non-limiting example, if the ramp angle 548 of the ramp 528 is 57 degrees, then the ramp angle 550 of the ramp 530 may be 52 degrees.

In the embodiment illustrated in FIGS. 5A-B, the key assembly 500 employs a key stabilization technique by including reverse ramps (only reverse ramps 544 shown) in the base 506 and providing reverse ramp contacting features (only reverse ramp contacting feature 552 shown) in the keycap 502. This key stabilization feature offers an advantage in the event a user presses the keycap 502 off-center. As a non-limiting example, if the keycap touchsurface 504 were to be pressed by the application of a press force 546 near a front edge of the keycap (the left side of the keycap illustrated in FIG. 5A), the ramp contacting feature 526 may move away from the ramp 528 and thus "float" on the backside of the keycap because the magnetic ready/return mechanism tends to pull (magnetically attract) the rear of the keycap upward. This can cause the keycap 502 to tilt (rotate about the Y axis) while moving toward the pressed position which may result in an undesirable user experience. However, as the keycap translates (moves in the positive X direction) due to the PTE mechanism, the reverse ramp contacting feature 552 contacts and moves along reverse ramp 544 driving the back of the keycap 502 toward the pressed position in a more planar manner and any tilting of the keycap 502 can be reduced. Typically, a gap 554 is used between the reverse ramp 544 and the reverse ramp contacting feature 552 to ease manufacturing tolerance requirements to facilitate manufacturability of the key assembly 500. As the keycap translates (moves in the positive X direction), the shallower ramp angle 550 of the ramp 530 causes the keycap 502 to translate more in the positive X direction. This action pulls the reverse ramp contacting feature 552 into the reverse ramp 544 absorbing the gap 554 which guides the reverse ramp side of the keycap (the right side in the illustration of FIG. 5A) toward the press position in a more consistent manner. Additionally, upon removal of the press force 546, the magnetic ready-return mechanism pulls the keycap 502 in the negative X direction as the keycap 502 moves toward the unpressed position.

In some embodiments, the key assembly 500 includes a sensor 560 for detecting the pressed state of the keycap 502 or the movement of the keycap 502 away from the unpressed state. The sensor 560 may use any appropriate technology, including any of the ones described herein. In some embodiments, the sensor 560 detects changes in capacitance and the keycap 502 comprises primarily dielectric material. The change in the position of the dielectric material of the keycap 502 causes the primary changes in capacitance detected by the sensor 560. In some embodiments, the sensor 560 detect changes in capacitance and conductive material is disposed in or on the keycap 502. The change in position of the conductive material of the keycap 502 causes the primary changes in capacitance detected by the sensor 560. In some embodiments, the sensor 560 detect changes in capacitance via the magnetic component of the keycap (320 in FIG. 3) as the keycap moves toward the unpressed position. In some embodiments, the senor 560 is configured to actively detect unpressed and pressed positions of the keycap 502. In some embodiments, the sensor 560 is configured to actively detect only the pressed state of the keycap 502, and it is assumed that no detection of the pressed state means the keycap 502 is unpressed, or vice versa. A processing system (not shown) communicatively coupled to the sensor 560 operates the sensor 560 to produce signals indicative of the pressed state of the key assembly, and determines a press state of the keycap 502 based on these signals.

As noted above, one advantage of employing PTE mechanisms in key assemblies is that keypads or keyboards can be made substantially thinner while providing a similar user tactile experience as normal or full thickness keyboards. Additionally, the keycaps can also be made thinner to further reduce the profile of a key assembly. However, thinning the keycaps can lead to undesirable flexing in a keycap, or to non-uniform movement across the keycap, in response to press input. Also, keycap flexing may cause non-uniform key travel across the keycap or otherwise interfere with proper keyboard performance. This is especially likely for wider keycaps. That is, keycap sizes may be defined based upon factors such as the customized layout, the amount of offset between rows of keys, the existence of special/non-alphanumeric keys, and the overall aspect ratio of the key matrix. If the keyboard front-to-keyboard back dimension is the length, and the keyboard left-to-keyboard right dimension is the width, some example width-to-length ratios that may be found in various keyboards include 1:1, 1.5:1, 1.75:1, and 2.25:1.

In some embodiments of keyboards, the 1:1 keycaps are square in footprint, and are often used for the alphanumeric keys. The 1.5:1 keycaps may be found in some keyboards as "Ctrl" or the function keys. The 1.75:1 keycaps may be found in some keyboards as the backslash, tab, escape, delete or other keys. The 2.25:1 keycaps may be found in some keyboards as shift or enter or other keys. As will be appreciated, any ratio may be used in a keyboard. For example, some keyboards use keycaps with ratio 0.5:1 as delete, escape, function keys or "arrow" navigation keys. As another example, some keyboards use keycaps with 1:2 ratios for backspace, caps lock, or other keys. Additionally, there can be other size options and the left and right side of the keyboard may have slightly different widths. Also, some keyboards feature keys have a unique shape, such as, a reversed "L" shape for the enter key. Oftentimes, the bottom row of keys may have a longer length. Accordingly, it may be desirable in some implementations to provide key stabilization techniques for these wider ratio keycaps.

Figure 6A:
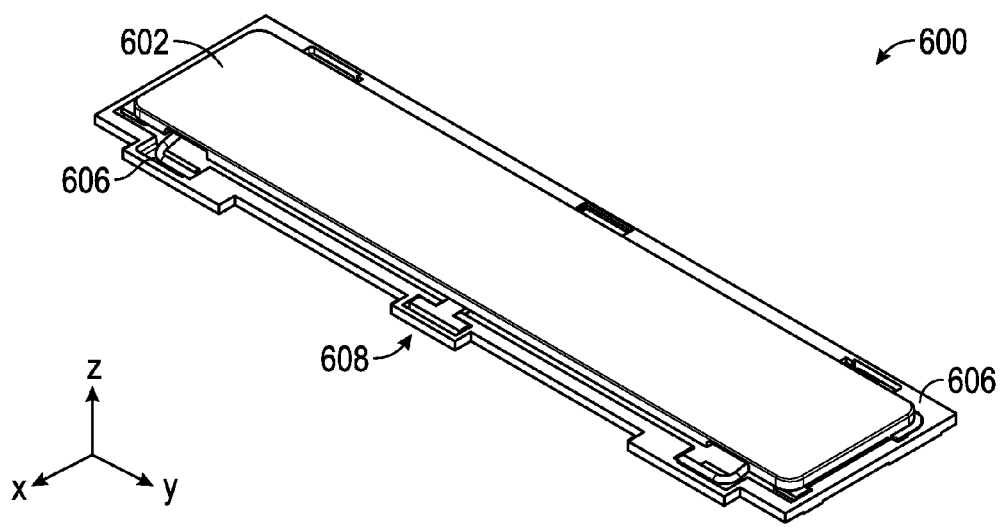
FIG. 6A-C illustrate a key assembly in accordance with key stabilization techniques in accordance with an embodiment.
Figure 6B:
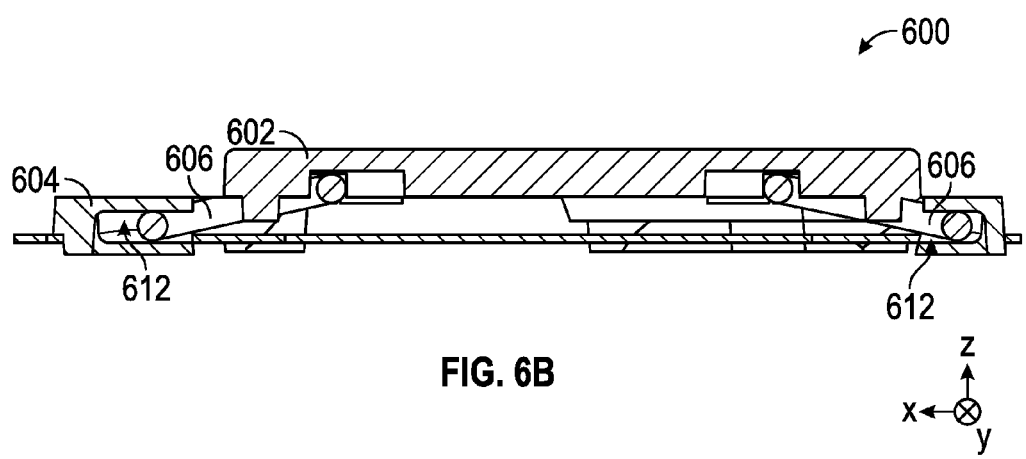
Figure 6C:
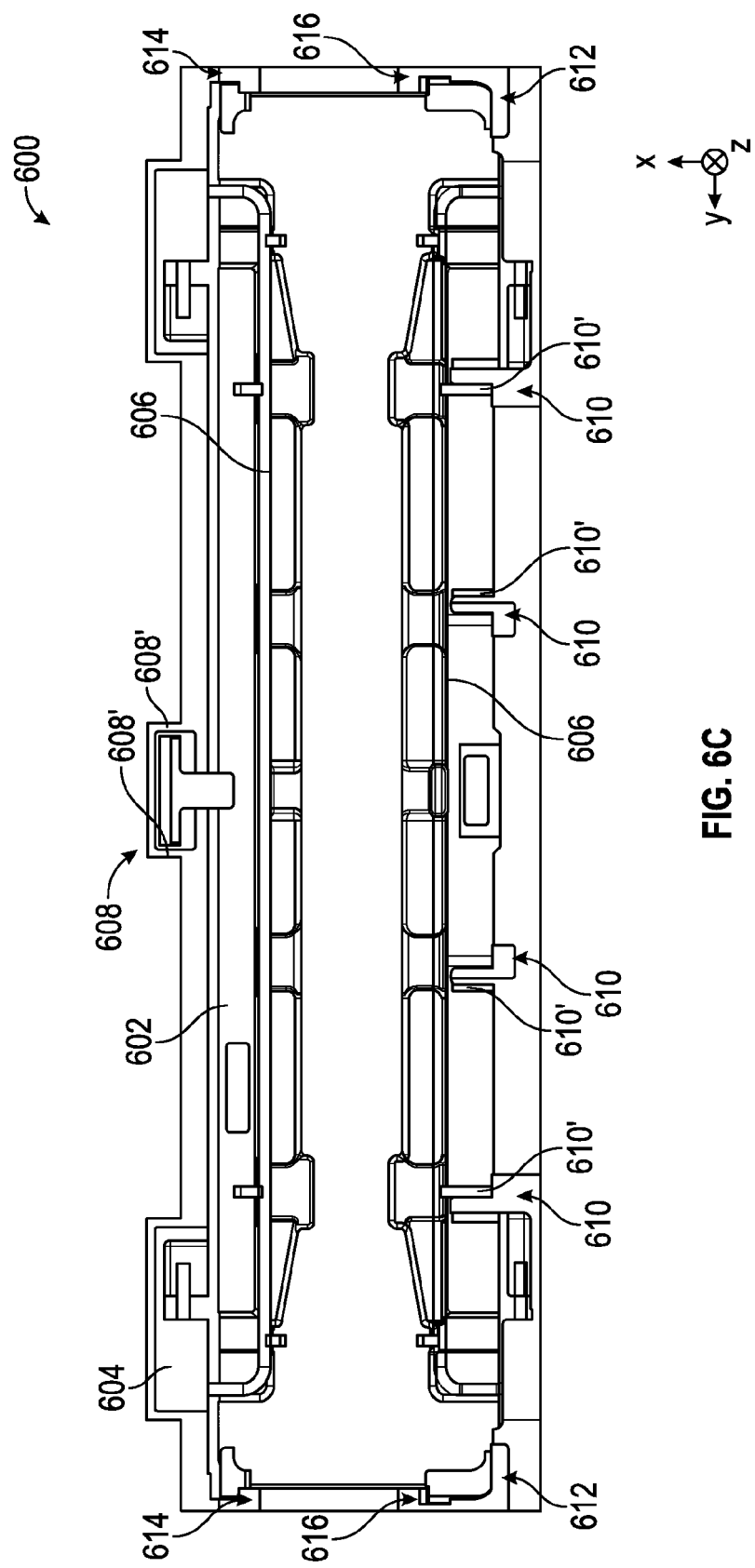

FIGS. 6A-C are illustrations of a key assembly 600 having a width:length ratio of about 1:5 (e.g., space bar) employing key stabilization techniques. As noted above, the key assembly 600 employs a planar-translation-effecting (PTE) mechanism configured to impart planar translation to the keycap 602 when it moves between the unpressed and pressed positions, such that a nonzero component of lateral (positive X direction) motion occurs.

The key assembly 600 includes a keycap 602 and a base 604. To enhance key stabilization during the vertical and translation movement of the keycap 602 caused by the PTE mechanism, stabilizing wires (or bars) 606 are employed. In some embodiments only one stabilizing wire 606 might be used, while in other implementations, two stabilizing wires 606 may be employed. In the illustrated embodiment, the stabilizing wires 606 are connected to the base 606 and extend substantially along the length of the longer axis (along the Y direction in FIG. 6A) near an edge of the keycap 602. In operation, the stabilizer wires 606 transfer motion from one side of a keycap 602 (e.g., left side) to the other side of the keycap 602 (e.g., right side). For example, when a press force is applied to the left side of a keycap 602, the stabilizer wires 606 cause both ends of the stabilizer wires 606 to rotate. Accordingly, while the press force moves one side of the keycap directly, the stabilizer wire 606 partially or entirely moves the other side of the keycap 602 so that a more planar translation of the keycap occurs as the keycap 602 moves from the unpressed position to the pressed position. The stabilizing wires 606 may be made of any material desired for any particular implementation including, but not limited to, metal (e.g., nickel, steel, titanium or an alloy), plastic, nylon or a composite material having the desired strength (for stabilization) and weight (to maintain a light keyboard).

FIG. 6B shows a cross-section of the key assembly 600 with the stabilizing wires 606 coupled to the keycap 602 by retaining features 610 and slidably engaging the base 604 in recesses 612 that allow the stabilizing wires 606 to translate (in the X direction) as the stabilizing wires 606 rotate to facilitate the keycap moving toward the pressed position. In other embodiments, it will be appreciated that that stabilizing wires 606 may be retained by the base 604 and slidably engage the keycap 602. In some embodiments, one stabilizing wires 606 may be retained by the keycap 602 and slidably engages the base 604, while a second stabilizing wires 606 slidably engages the keycap 602 and is retained by the base 604.

FIG. 6A also illustrates the use of intermediate ramp and ramp contacting feature pairs 608 to promote key stabilization and reduce key flexing as the keycap moves from the unpressed position toward the pressed position. Also shown in FIG. 6C are the ramp and ramp contacting feature pairs 612 and 614 and reverse ramps and reverse ramp contacting features 616 that operate in the same manner as discussed in connection with FIGS. 5A-B. Each of the intermediate ramps and corresponding intermediate ramp contacting features (referred to as intermediate ramp pairs) 608 and 610 also operate to provide a PTE mechanism together with the ramps and ramp contacting features 612, 614 and reverse ramps and reverse ramp contacting features 616.

The intermediate ramp pairs are most clearly seen in the bottom plan view of FIG. 6C. In the illustrated embodiment, the intermediate ramp pair 608 has a "T" shaped configuration and includes side guiding features 608' to provide further stabilization for the keycap 602. This embodiment also shows four intermediate ramp pairs 610 along the opposite side of the key assembly 600. The intermediate ramp pairs 610 also include side guiding features 610' on either side of the intermediate ramp pairs 610 for further key stabilization. It will be appreciated that more or fewer intermediate ramp pairs may be used in any particular implementation depending in part on the length:width ratio of the key assembly. It will be appreciated that in any particular implementation, reverse ramps, stabilization wires and intermediate ramps may be used together, alone or in any combination to provide key stabilization for the implementation realized.

As noted above, in some embodiments the stabilizing wires may be retained by the keycap and slidably engage the base, or the stabilizing wires may be retained by the base and slidably engage the keycap, or a combination may be employed where one stabilizing wire may be retained by the keycap and slidably engages the base, while a second stabilizing wire slidably engages the keycap and is retained by the base.

Figure 7A:
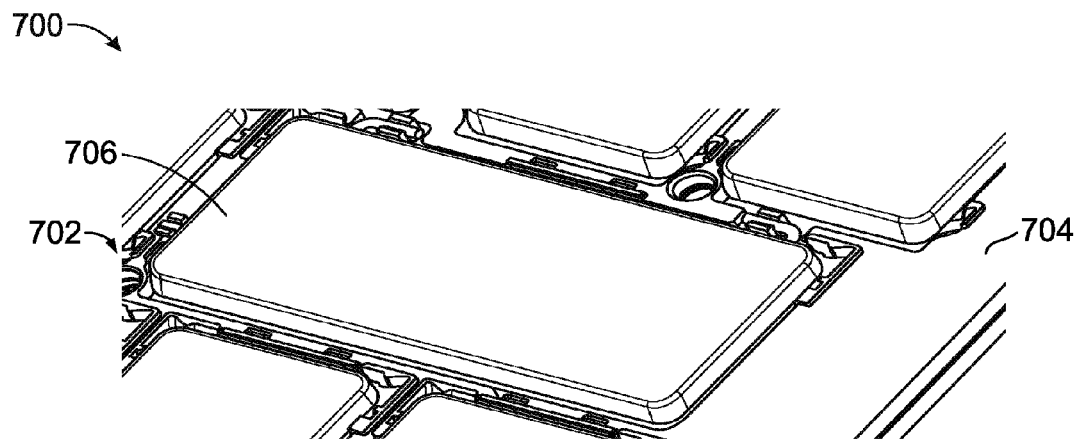
FIG. 7A-B illustrate a key assembly in accordance with key stabilization techniques in accordance with an embodiment.
Figure 7B:
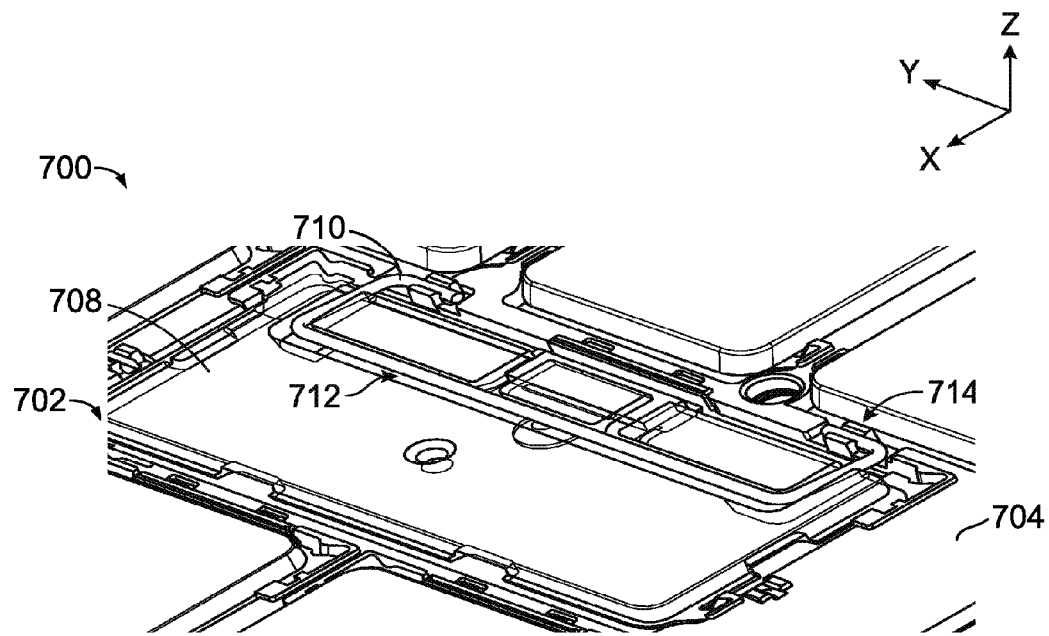

FIGS. 7A-B illustrate an embodiment of a key assembly 700 where the stabilizing wire is retained by the base 704 and slidably engage the keycap 702. In the illustrated embodiment, the keycap 702 comprises a two-part keycap having a first portion 706 and a second portion 708. The stabilizing wire 710 slidably engages the keycap 702 in a recess 712 formed in the second portion 708 and translates within the recess 712 between the first portion 706 and the second portion 708 of the keycap 702 after assembly. As can be seen, the stabilizing wire 710 extend substantially along the length of the longer axis (along the Y direction in FIG. 7A) near an edge of the keycap 702. The stabilizing wire is pivotally connected to the base 704 by retaining features 714, which may have a snap-in feature for ease of assembly. The stabilizing wire 710 may be made of any material desired for any particular implementation including, but not limited to, metal (e.g., nickel, steel, titanium or an alloy), plastic, nylon or a composite material having the desired strength (for stabilization) and weight (to maintain a light keyboard). In a similar manner as discussed in connection with FIGS. 6A-C, the stabilizer wire 710 operates to transfer motion from one side of a keycap 702 (e.g., left side) to the other side of the keycap 702 (e.g., right side). This operation stabilizes the keycap 702 as it moves from the unpressed position toward the pressed position.

Figure 8A:
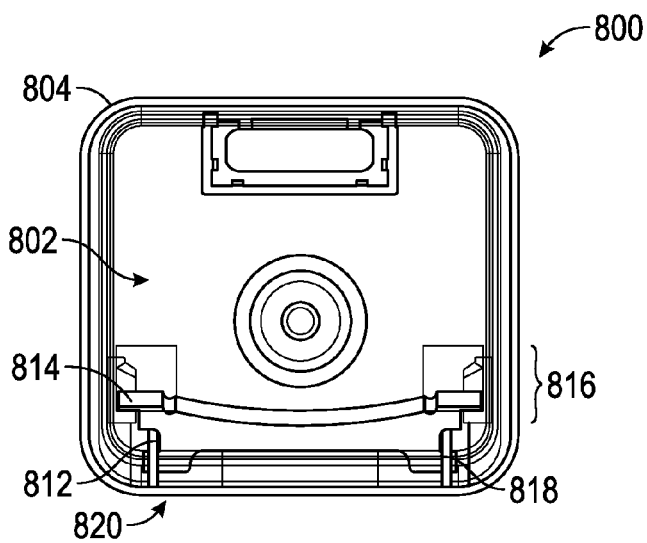
FIG. 8A-B illustrate a key assembly in accordance with key stabilization techniques in accordance with an embodiment.
Figure 8B:
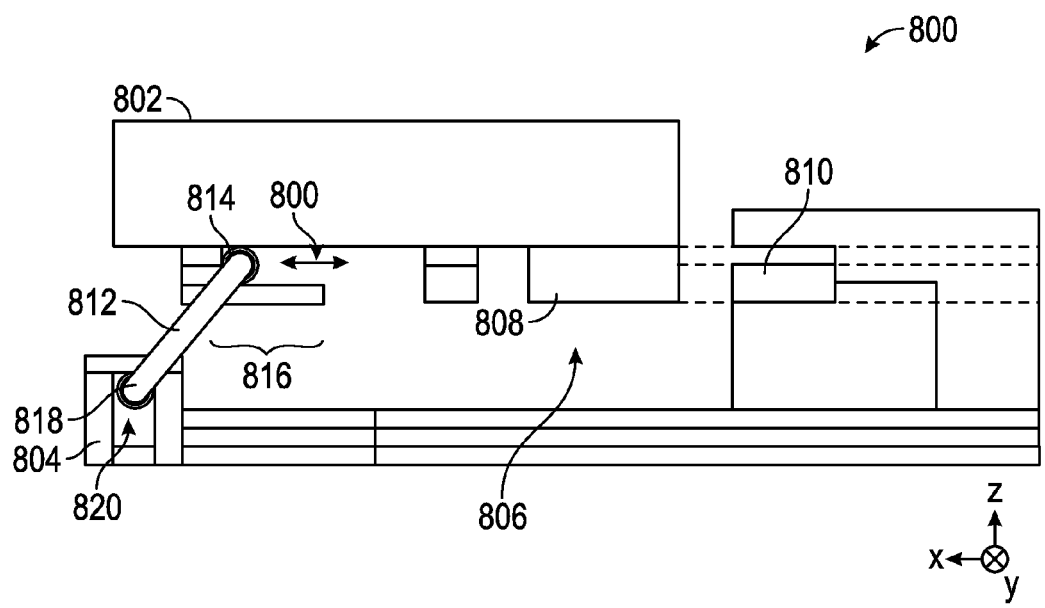

FIGS. 8A-B illustrates another key stabilization embodiment beneficial to PTE key assemblies employing a magnetic ready-return mechanism. The key assembly 800 comprises a keycap 802, a base 804 and a magnetic ready-return mechanism 806. The magnetic ready-return mechanism 806 comprises a first magnetic component 808 and a second magnetic component 810. In some embodiments, both the first magnetic component 808 and the second magnetic component 810 are magnets. In some embodiments, one of the first magnetic component 808 and the second magnetic component 810 is a magnet, while the other is a non-magnetic ferrous material. Non-limiting examples of magnets include neodymium iron boron, samarium cobalt, alnico and ceramic magnets. Non-limiting examples of non-magnetic material includes steel (including some stainless steels), iron and nickel.

As will be appreciated, during manufacture of the key assembly 800, the side of the key assembly 800 having the ready-return mechanism 806 provides a magnetic retention of the keycap 802 to the base 804. However, the opposite side of the key assembly 800 does not provide Z direction retention of the keycap 802 until a finishing bezel is position around the key assembly or a keypad or keyboard including multiple key assemblies. Accordingly, if the key assembly 800 is inverted or tilted during manufacture, it is possible that the keycap 802 will tilt away from the base 804 complicating the assembly process.

Accordingly, the embodiment illustrated in FIGS. 8A-B contemplates the use of a stabilizing bar 812 that provides key stabilization during key operation, as well as keycap 802 retention to base 804 during assembly. FIG. 8A is illustrated with the keycap 802 shown transparent to facilitate understanding of the dual features of the stabilizing bar 812. The stabilizing bar 812 includes protrusions 814 that slidably engage recesses 816 in the keycap 802. The hooking engagement of the protrusions 814 with the recesses 816 provide Z direction retention during the assembly process. Also, the stabilizing bar 812 includes protrusions 818 that are received by recesses 820 in the base 804, which provides a pivoting connection between the base 804 and the stabilizing bar 812. Thus, during key operation, the stabilizing bar 812 operates in a manner similar to the stabilizing wires discussed in connection with FIGS. 6A-C to provide a stabilizing function as the keycap moves from the unpressed position toward the pressed position via the PTE mechanism (not shown in FIGS. 8A-B).

Thus, the key stabilization techniques described herein can be used to implement any number of devices utilizing different touchsurface assemblies, including a variety of keyboards each comprising one or more key assemblies in accordance with the techniques described herein. Some components may be shared when multiple touchsurfaces are placed in the same device. For example, the base may be shared by two or more touchsurfaces. As another example, the keyswitch sensor may be shared through sharing sensor substrates, sensor electrodes, or the like.

The implementations described herein are meant as examples, and many variations are possible. As one example, any appropriate feature described with one implementation may be incorporated with another. As a first specific example, any of the implementations described herein may or may not utilize a finishing tactile, aesthetic, or protective layer. As a second specific example, non-magnetic ferrous materials may be used to replace magnets in various magnetically coupled component arrangements.

In addition, the structure providing any function may comprise any number of appropriate components. For example, a same component may provide leveling, planar translation effecting, readying, and returning functions for a key press. As another example, different components may be provide these functions, such that a first component levels, a second component effects planar translation, a third component readies, and a fourth component returns. As yet another example, two or more components may provide a same function. For example, in some embodiments, magnets and springs together provide the return function, or the ready and return functions. Thus, the techniques described in the various implementations herein may be used in conjunction with each other, even where the function may seem redundant. For example, some embodiments use springs to back-up or augment magnetically-based ready/return mechanisms.

What is claimed is:

1. A key assembly, comprising:
a keycap having a touch surface for receiving a press force that moves the keycap from an unpressed position toward a pressed position, the unpressed position and pressed position separated in a press direction and a second direction orthogonal to the press direction;
a base having a planar-translation effecting mechanism comprising a ramp, the ramp supporting the keycap to guide the keycap in the press direction and the second direction as the keycap moves from the unpressed position toward the pressed position; and
a stabilizing wire coupled to the base, the stabilizing wire configured to transfer motion from a first side of the keycap to a second side of the keycap so that the touch surface remains substantially planar while the keycap moves from the unpressed position toward the pressed position,
wherein the stabilizing wire resists tilt of the keycap and rotation of the keycap about an axis in the press direction as the keycap moves toward the pressed position.

2. The key assembly of claim 1, further comprising:
reverse ramp features on the base and reverse ramp contacting features on the keycap, wherein when a press force is applied off-center on one portion of the touch surface, the reverse ramp features and reverse ramp contacting features drive an opposite portion of the touch surface toward the planar-translation effecting mechanism.

3. The key assembly of claim 1, wherein:
the keycap includes a first magnetic component;
the base includes a second magnetic component for the keycap; and
the first and second magnetic components form a ready-return mechanism that biases the keycap toward the unpressed position.

4. The key assembly of claim 3, wherein one of the first and second magnetic components comprises a non-magnetized ferrous material.

5. The key assembly of claim 1, wherein the planar-translation effecting mechanism comprises ramp features on the base and the keycap includes ramp contacting features that move along the ramp features as the keycap moves from the unpressed position toward the pressed position.

6. The key assembly of claim 1, wherein the keycap has an aspect ratio between 1:1.5-5:1 with a longer axis and a shorter axis.

7. The key assembly of claim 6, wherein the stabilizing wire is substantially along a length of the longer axis.

8. The key assembly of claim 7, wherein the stabilizing wire is pivotally connected to one of the keycap and base, and has a sliding connection with the other of the keycap and base.

9. The key assembly of claim 7, wherein the stabilizing wire is configured near one edge of the keycap along the length of the longer axis and the key stabilization mechanism includes another stabilizing wire positioned near an opposite edge of the keycap along the length of the longer axis.

10. The key assembly of claim 7, wherein the stabilizing wire is pivotally connected to the base and has a sliding connection configured between the first side and the second side of the keycap.

11. The key assembly of claim 6, further comprising:
intermediate ramp features in the base along the longer axis and corresponding intermediate ramp contacting features on the keycap.

12. The key assembly of claim 11, further comprising:
guides positioned on either side of the intermediate ramp features in the base to stabilize the keycap and guide the intermediate ramp contacting features when moving along the intermediate ramp features toward the pressed position.

13. The key assembly of claim 1, further comprising a capacitive sensor for sensing when the keycap is in the pressed position.

14. A keyboard, comprising:
a plurality of keycaps, each keycap of the plurality of keycaps having a touch surface for receiving a press force that moves a respective keycap of the plurality of keycaps from an unpressed position towards a pressed position, the unpressed position and pressed position separated in a press direction and a second direction orthogonal to the press direction;
a base having a plurality of planar-translation effecting mechanisms, each planar-translation effecting mechanism of the plurality of planar-translation effecting mechanisms comprising a respective ramp supporting the respective keycap to guide the respective keycap in the press direction and the second direction as the respective keycap moves from the unpressed position toward the pressed position; and
a plurality of stabilizing wires coupled to the base, each stabilizing wire of the plurality of stabilizing wires configured to transfer motion from a first side of the respective keycap to a second side of the pressed keycap so that the touch surface remains substantially planar while the respective keycap moves from the unpressed position toward the pressed position,
wherein each stabilizing wire of the plurality of stabilizing wires resist tilt of the respective keycap and rotation of the pressed keycap about an axis in the press direction as the respective keycap moves toward the pressed position.

15. The keyboard of claim 14, further comprising:
reverse ramp features on the base and reverse ramp contacting features on corresponding keycaps of the plurality of keycaps, wherein, when a press force is applied off-center on one portion of the touch surface, the reverse ramp features and reverse ramp contacting features drive an opposite portion of the touch surface toward a respective planar-translation effecting mechanism of the plurality of planar-translation effecting mechanisms.

16. The keyboard of claim 14, wherein:
each of the plurality of keycaps includes a first magnetic component;
the base includes a second magnetic component for each respective keycap of the plurality of keycaps; and
the first and second magnetic components of each respective keycap form a ready-return mechanism that biases the respective keycap toward the unpressed position.

17. The keyboard of claim 16, wherein one of the first and second magnetic components of each respective keycap of the plurality of keycaps comprises a non-magnetized ferrous material.

18. The keyboard of claim 14, wherein at least a portion of the plurality of keycaps have an aspect ratio between 1.5:1-5:1 with a longer axis and a shorter axis.

19. The keyboard of claim 18, wherein the plurality of stabilizing wires comprises a stabilizing wire that is substantially along length of the longer axis of a keycap of the portion of the plurality of keycaps.

20. The keyboard of claim 19, wherein the stabilizing wire is pivotally connected to the base and has a sliding connection with the keycap.

21. The keyboard of claim 18, further comprising intermediate ramp features in the base along the longer axis and intermediate ramp contacting features on a corresponding keycap.

22. The keyboard of claim 21, further comprising guides positioned on either side of the intermediate ramp features in the base to stabilize the corresponding keycap and guide the intermediate ramp contacting features when moving along the intermediate ramp features toward the pressed position.

23. A method of effecting motion of a keycap, the method comprising:
in response to an off-center press force on a first side portion of the keycap, a stabilizing wire of the keycap having, a contact a planar-translation effecting mechanism in a base, thereby transferring motion from the first side portion of the keycap toward a second side portion of the keycap as the keycap moves along a press direction,
wherein the keycap is supported in an unpressed position by the planar-translation effecting mechanism comprising a ramp, the ramp configured to guide the keycap between the unpressed position and a pressed position,
wherein the stabilizing wire is coupled to the base, and
wherein the unpressed position and the pressed position are separated in the press direction and in a direction orthogonal to the press direction.

* * * * *